(12) United States Patent (10) Patent No.: US 8,962,224 B2
Wu et al. (45) Date of Patent: Feb. 24, 2015

(54) METHODS FOR CONTROLLING DEFECTS FOR EXTREME ULTRAVIOLET LITHOGRAPHY (EUVL) PHOTOMASK SUBSTRATE

(71) Applicants: Banqiu Wu, Sunnyvale, CA (US); Ajay Kumar, Cupertino, CA (US); Omkaram Nalamasu, San Jose, CA (US)

(72) Inventors: Banqiu Wu, Sunnyvale, CA (US); Ajay Kumar, Cupertino, CA (US); Omkaram Nalamasu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

(21) Appl. No.: 13/774,010

(22) Filed: Feb. 22, 2013

(65) Prior Publication Data

US 2014/0045103 A1 Feb. 13, 2014

Related U.S. Application Data

(60) Provisional application No. 61/682,491, filed on Aug. 13, 2012, provisional application No. 61/713,193, filed on Oct. 12, 2012.

(51) Int. Cl.
*G03F 1/00* (2012.01)
(52) U.S. Cl.
CPC ........................................ *G03F 1/00* (2013.01)
USPC ................ 430/5; 430/252; 430/313; 430/315
(58) Field of Classification Search
USPC ...................... 430/5, 252, 313, 315
See application file for complete search history.

(56) References Cited

U.S. PATENT DOCUMENTS

| | | | |
|---|---|---|---|
| 4,778,561 A | 10/1988 | Ghanbari | |
| 4,877,509 A | 10/1989 | Ogawa et al. | |
| 5,133,826 A | 7/1992 | Dandl | |
| 5,366,586 A | 11/1994 | Samukawa | |
| 5,463,226 A | 10/1995 | Matsuzaki et al. | |
| 5,534,109 A | 7/1996 | Fujiwara et al. | |
| 6,196,155 B1 | 3/2001 | Setoyama et al. | |
| 6,396,900 B1 | 5/2002 | Barbee, Jr. et al. | |
| 6,536,449 B1 | 3/2003 | Ranft et al. | |
| 6,551,445 B1 | 4/2003 | Yokogawa et al. | |
| 7,662,542 B2 | 2/2010 | Shiobara et al. | |
| 2003/0159644 A1 | 8/2003 | Yonehara et al. | |
| 2004/0166612 A1 | 8/2004 | Maydan et al. | |
| 2005/0070073 A1 | 3/2005 | Al-Bayati et al. | |
| 2005/0158650 A1 | 7/2005 | Yueh et al. | |
| 2006/0081558 A1 | 4/2006 | Collins et al. | |
| 2006/0237127 A1 | 10/2006 | Inatomi | |
| 2006/0290287 A1 | 12/2006 | Kuninaka | |
| 2007/0003864 A1 | 1/2007 | Wagner et al. | |
| 2008/0144050 A1 | 6/2008 | Shyu et al. | |
| 2010/0231130 A1 | 9/2010 | Labetski et al. | |
| 2012/0135584 A1 | 5/2012 | Yokokawa et al. | |

FOREIGN PATENT DOCUMENTS

KR 10-2006-0029039 4/2006

OTHER PUBLICATIONS

PCT search report and written opinion for PCT/US2013/051977 dated Nov. 7, 2013. PCT search report is also the concise statement of relevance for Korean Reference No. 10-2008-0029039.

*Primary Examiner* — Christopher Young (74) *Attorney, Agent, or Firm* — Patterson & Sheridan, LLP (57) ABSTRACT

Methods for providing a silicon layer on a photomask substrate surface with minimum defeats for fabricating film stack thereon for EUVL applications are provided. In one embodiment, a method for forming a silicon layer on a photomask substrate includes performing an oxidation process to form a silicon oxide layer on a surface of a first substrate wherein the first substrate comprises a crystalline silicon material, performing an ion implantation process to define a cleavage plane in the first substrate, and bonding the silicon oxide layer to a surface of a second substrate, wherein the second substrate is a quartz photomask.

20 Claims, 6 Drawing Sheets

METHODS FOR CONTROLLING DEFECTS FOR EXTREME ULTRAVIOLET LITHOGRAPHY (EUVL) PHOTOMASK SUBSTRATE

CROSS-REFERENCE TO RELATED APPLICATIONS

This application claims benefit of U.S. Provisional Application Ser. No. 61/682,491 filed Aug. 13, 2012 and U.S. Provisional Application Ser. No. 61/713,193, filed Oct. 12, 2012, both of which are incorporated by reference in their entirety.

BACKGROUND OF THE INVENTION

1. Field of the Invention

Embodiments of the invention generally relate to the field of semiconductor manufacturing processes and devices, more particular, to methods of controlling defects for extreme ultraviolet lithography (EUVL) photomask substrate.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

With the shrink of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. There are several NGL candidates, such as extreme ultraviolet (EUV) lithography (EUVL), electron projection lithography (EPL), ion projection lithography (IPL), nano-imprint, and X-ray lithography. Among these, EUVL is the most likely successor due to the fact that EUVL has most of the properties of optical lithography, which is more mature technology as compared with other NGL methods.

A photomask is typically a glass or a quartz substrate having a film stack with multiple layers, including a light-absorbing layer, an opaque layer, a capping layer and so on sequentially disposed thereon. As feature sizes formed on the photomask have become smaller, the demand for high quality substrate with minimum defect has increased. Impurities, such as pits, particles, scratches, or other defects, contained in the quartz substrate may adversely cause detectable phase shifts in the beam reflected from the quartz substrate during a lithography process, resulting inaccurate feature size transfer. Furthermore, impurities formed in the substrate may cause small topographic variations on the substrate surface, which may later affect film growth and morphology. Small topographical variations from the substrate surface may also translate to variations to the film stack formed thereon, thereby distorting the structures of the film stack and affecting feature translation to the film stack.

Therefore, there is a need to improve quality of the substrate with minimum defects for EUVL fabrication.

SUMMARY OF THE INVENTION

Methods for forming a silicon layer on a photomask substrate surface with minimum defeats for fabricating film stack thereon for EUVL applications are provided. In one embodiment, a method for forming a silicon layer on a photomask substrate includes performing an oxidation process to form a silicon oxide layer on a surface of a first substrate wherein the first substrate comprises a crystalline silicon material, performing an ion implantation process to define a cleavage plane in the first substrate, and bonding the silicon oxide layer to a surface of a second substrate, wherein the second substrate is a quartz photomask.

In another embodiment, a photomask substrate for EUVL application includes a quartz photomask substrate, a silicon oxide layer formed on a surface of the substrate, a crystalline silicon layer formed on the silicon oxide layer, and a reflective multi-material layer disposed on the crystalline silicon layer.

In yet another embodiment, a method for forming a silicon layer on a photomask substrate includes performing an oxidation process to form a silicon oxide layer on a first surface of a first substrate, wherein the first substrate comprises a crystalline silicon material, bonding the silicon oxide layer to a first surface of a second substrate, wherein the second substrate is a quartz photomask, performing a chemical mechanical polishing process to polish a portion of the first substrate from a second surface of the first substrate, and forming a crystalline silicon layer from the first substrate on the surface of the second substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3H depict cross section views of a photomask substrate having a silicon layer formed thereon according to the method of FIG. 2.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for improving surface quality of a photomask substrate used in photomask fabrication, particularly for EUVL applications. The improved surface quality of the photomask substrate facilitates forming film structures on the substrate surface without deformation, distortion or causing undesired phrase shift or other phase defects during an exposure process. In one embodiment, a crystalline silicon layer, such as crystalline silicon layer is a single crystalline silicon layer, is formed on a quartz substrate suitable for fabricating a photomask for EUVL applications. The single crystalline silicon layer is formed on the quartz substrate by a plasma immersion ion process, utilizing a substrate having a single crystalline silicon source (e.g., a silicon donor) to be bonded onto the substrates. The single crystalline silicon layer may provide pure crystalline silicon material with minimum defects to a quartz surface, thereby providing a good surface for the film stack processed by EUVL techniques with desired dimension, profile and functions.

Figure 1:
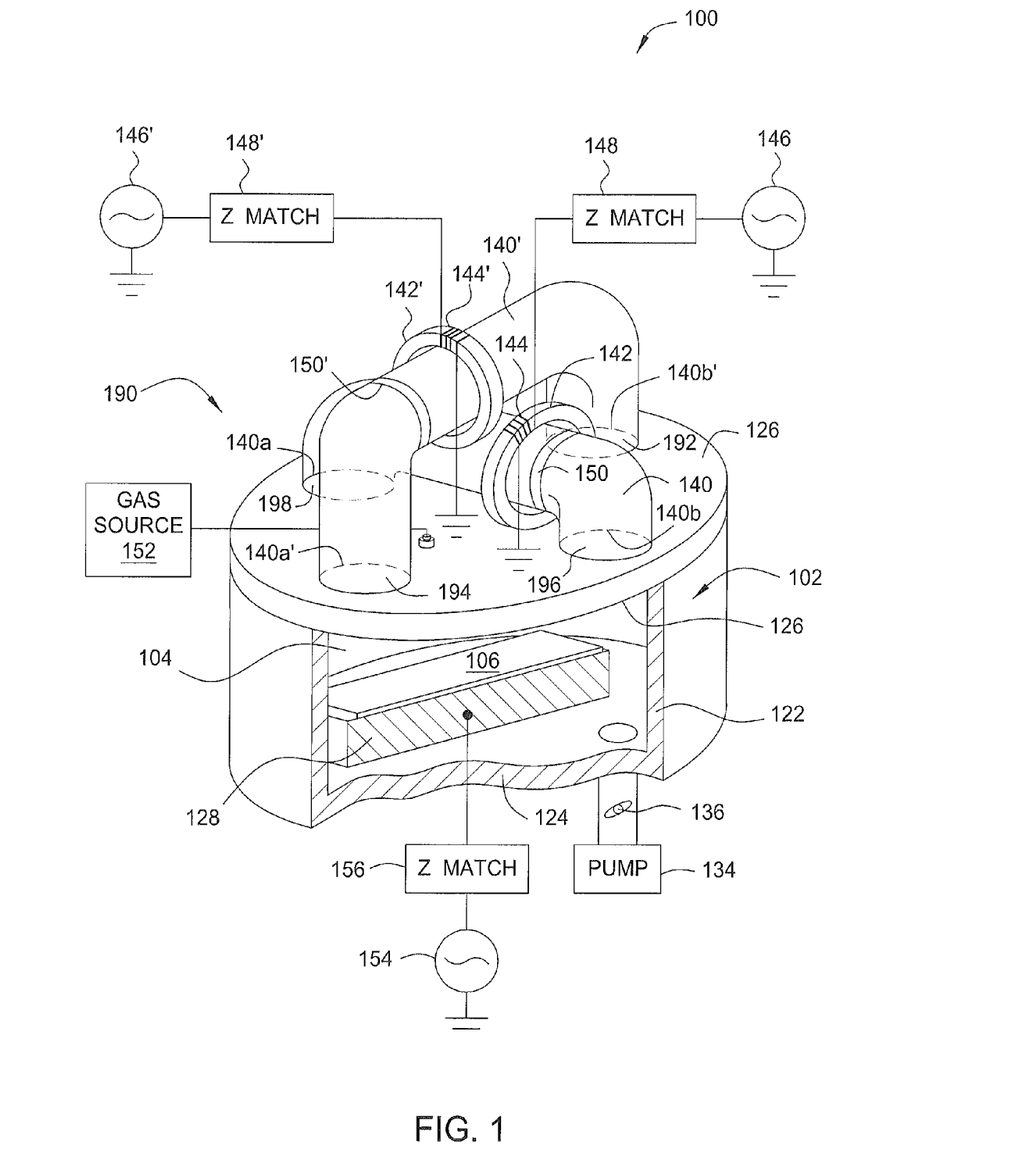
FIG. 1 depicts one embodiment of a plasma immersion ion implantation tool suitable for practicing the present invention.

FIG. 1 is an isometric view of a plasma immersion ion implantation chamber that may be utilized to practice embodiments of the present invention. The chamber of FIG. 1 is useful for performing plasma immersion ion implantation procedures and an etching process, but may also be used to shower a substrate with energetic ions without implanting or to gently treat to the substrate surface. The processing chamber 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. In one embodiment, the substrate support assembly 128 may include an embedded heater element or cooling element (not shown) suitable for controlling the temperature of the substrate 106 supported on the substrate support assembly 128. In one embodiment, the temperature of the substrate support assembly 128 may be controlled to prevent the substrate 106 from overheating during the plasma immersion ion implantation process and/or the etching process so as to maintain the substrate 106 at a substantially constant temperature during the plasma immersion ion implantation process. The temperature of the substrate support assembly 128 may be controlled between about 10 degrees Celsius to about 200 degrees Celsius.

The chamber 100 depicted in FIG. 1 further includes a plasma source 190. The plasma source 190 includes a pair of separate external reentrant conduits 140, 140' mounted on the outside of the top 126 of the chamber body 102 disposed transverse or orthogonal to one another. The first external conduit 140 has a first end 140a coupled to an opening 198 formed in the top 126 and is in communication with a first side of the process region 104 in the chamber body 102. A second end 140b has an opening 196 coupled to the top 126 and is in communication with a second side of the process region 104. The second external reentrant conduit 140' has a first end 140a' having an opening 194 coupled to the top 126 and in communication with a third side of the process region 104. A second end 140b' having an opening 192 of the second external reentrant conduit 140' is coupled to the top 126 and is in communication with a fourth side of the process region 104. In one embodiment, the first and second external reentrant conduits 140, 140' are configured to be orthogonal to one another, thereby providing the two ends 140a, 140a', 140b, 140b' of each external reentrant conduits 140, 140' orientated at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may have other configurations utilized to control plasma distribution in the process region 104.

Magnetically permeable torroidal cores 142, 142' surround a portion of a corresponding one of the external reentrant conduits 140, 140'. The conductive coils 144, 144' are coupled to respective RF power sources 146, 146' through respective impedance match circuits or elements 148, 148'. Each external reentrant conduits 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF bias generator 154 coupled to the substrate support assembly 128 through an impedance match circuit or element 156.

Process gases including gaseous compounds supplied from the process gas source 152 are introduced through the overhead gas distribution plate 130 into the process region 104. RF power source 146 is coupled from the power applicators, i.e., core and coil, 142', 144' to gases supplied in the conduit 140, which creates a circulating plasma current in a first closed torroidal path power source 146' may be coupled from the other power applicators, i.e., core and coil, 142', 144' to gases in the second external reentrant conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF power sources 146, 146', which may be the same or slightly offset from one another.

In operation, a process gas mixture is provided to the chamber from the process gas source 152. Depending on the embodiment, the process gas mixture may comprise inert or reactive gases to be ionized and directed toward the substrate 302. Virtually any gas that may be easily ionized can be used in the chamber 100 to practice embodiments of the invention. Some inert gases that may be used include helium, argon, neon, krypton, and xenon. Reactive or reactable gases that may be used include borane and its oligomers, such as diborane, phosphine and its oligomers, arsine, nitrogen containing gases, halogen containing gas, hydrogen containing gases, oxygen containing gases, carbon containing gases, and combinations thereof. In some embodiments, nitrogen gas, hydrogen gas, oxygen gas, and combinations thereof may be used. In other embodiments, ammonia and its derivatives, analogues, and homologues, may be used, or hydrocarbons such as methane or ethane may be used. In still other embodiments, halogen containing gases, such as fluorine or chlorine containing gases like $BF_3$, $PF_3$, may be used. Any substance that may be readily vaporized, and that does not deposit a material substantially identical to the magnetically susceptible layer of the substrate, may be used to modify its magnetic properties through bombardment or plasma immersion ion implantation. Most hydrides may be used, such as silane, borane, phosphine, $PF_3$, diborane ($B_2H_6$), methane ($CH_4$), and other hydrides. Also, carbon dioxide and carbon monoxide may be used.

The power of each RF power source 146, 146' is operated so that their combined effect efficiently dissociates the process gases supplied from the process gas source 152 and produces a desired ion flux at the surface of the substrate 106. The power of the RF bias generator 154 is controlled at a selected level at which the ion energy dissociated from the process gases may be accelerated toward the substrate surface and implanted at a desired depth below the top surface of the substrate 106 in a desired ion concentration. For example, with relatively low RF power of about 100 W would give ion energy of about 200 eV. Dissociated ions with low ion energy may be implanted at a shallow depth between about 1 Å and about 2000 Å, such as about 200 Å and 1000 Å from the substrate surface. Alternatively, high bias power of about 5000 W would give ion energy of about 6 keV. The dissociated ions with high ion energy provided and generated from high RF bias power, such as higher than about 100 eV, may be implanted into the substrate having a depth substantially over 500 Å depth from the substrate surface. In one embodiment, the bias RF power supplied to the chamber may be between about 100 Watts and about 7000 Watts, which equates to ion energy between about 100 eV and about 7 keV.

Whereas disrupting the alignment of atomic spins in selected portions of the magnetic layer is desired, ion implant with relatively high energy, such as between about 200 eV and about 5 keV, or between about 500 eV and about 4.8 keV, such as between about 2 keV and about 4 keV, for example about 3.5 keV, may be useful. The combination of the controlled RF plasma source power and RF plasma bias power dissociates electrons and ions in the gas mixture, imparts a desired momentum to the ions, and generates a desired ion distribution in the processing chamber 100. The ions are biased and driven toward the substrate surface, thereby implanting ions into the substrate in a desired ion concentration, distribution and depth from the substrate surface. In some embodiments, ions may be implanted at a concentration between about $10^{18}$ atoms/cm$^3$ and about $10^{23}$ atoms/cm$^3$ at a depth ranging from about 2 nm to about 100 nm, depending on the thickness of the magnetic layer.

It is noted that the ions provided in a plasma immersion ion implantation process, as described herein, are generated from a plasma formed by applying a high voltage RF or any other forms of EM field (microwave or DC) to a processing chamber. The plasma dissociated ions are then biased toward the substrate surface and implanted into a certain desired depth from the substrate surface. In the embodiment an etching process is desired to be performed to remove portion of the material layers from the substrate, an etchant may be used to form plasma to react and etch the material layers from the substrate surface, thereby removing the material layers from the substrate as needed.

It is noted that the conventional ion implantation processing chamber utilizing ion guns or ion beams accelerates a majority of ions up to a certain energy resulting in implanting the accelerated ions into a deeper region of the substrate, as compared to the ions implanted by the plasma immersion ion implantation process. The ions provided in the plasma immersion ion implantation process do not generally have a beam-like energy distribution as the ions in conventional beamliners. Due to several factors, such as ion collisions, process time and process space and varying intensity of accelerating plasma field, a significant fraction of plasma ions have an energy spread close to zero ion energy. Accordingly, the ion concentration profile formed in the substrate by a plasma immersion ion implantation process is different from the ion concentration profile formed in the substrate using a conventional ion implantation processing chamber, wherein the ions implanted by the plasma immersion ion implantation process are mostly distributed in close proximity to the surface of the substrate as compared to ions implanted using a conventional ion implantation processing chamber. Furthermore, the energy required to perform a plasma immersion ion implantation process is much less than the energy required to operate an ion gun (or an ion beam) ion implantation process. The higher energy required using a conventional ion gun (or an ion beam) ion implantation process results in ions with higher implantation energy that penetrate deeply below the substrate surface. In contrast, the plasma immersion ion implantation process utilizing RF power to plasma dissociate ions for implanting requires less energy which results in efficient control and implantation of ions to a relatively shadow depth from the substrate surface. Accordingly, plasma immersion ion implantation process provides an economical efficient ion implantation process and etching process, as compared to the conventional ion gun/beam ion implantation process, that implant ions into a substrate surface at desired depth or remove portion of material layers from the substrate surface with less energy and manufacturing cost.

Figure 2:
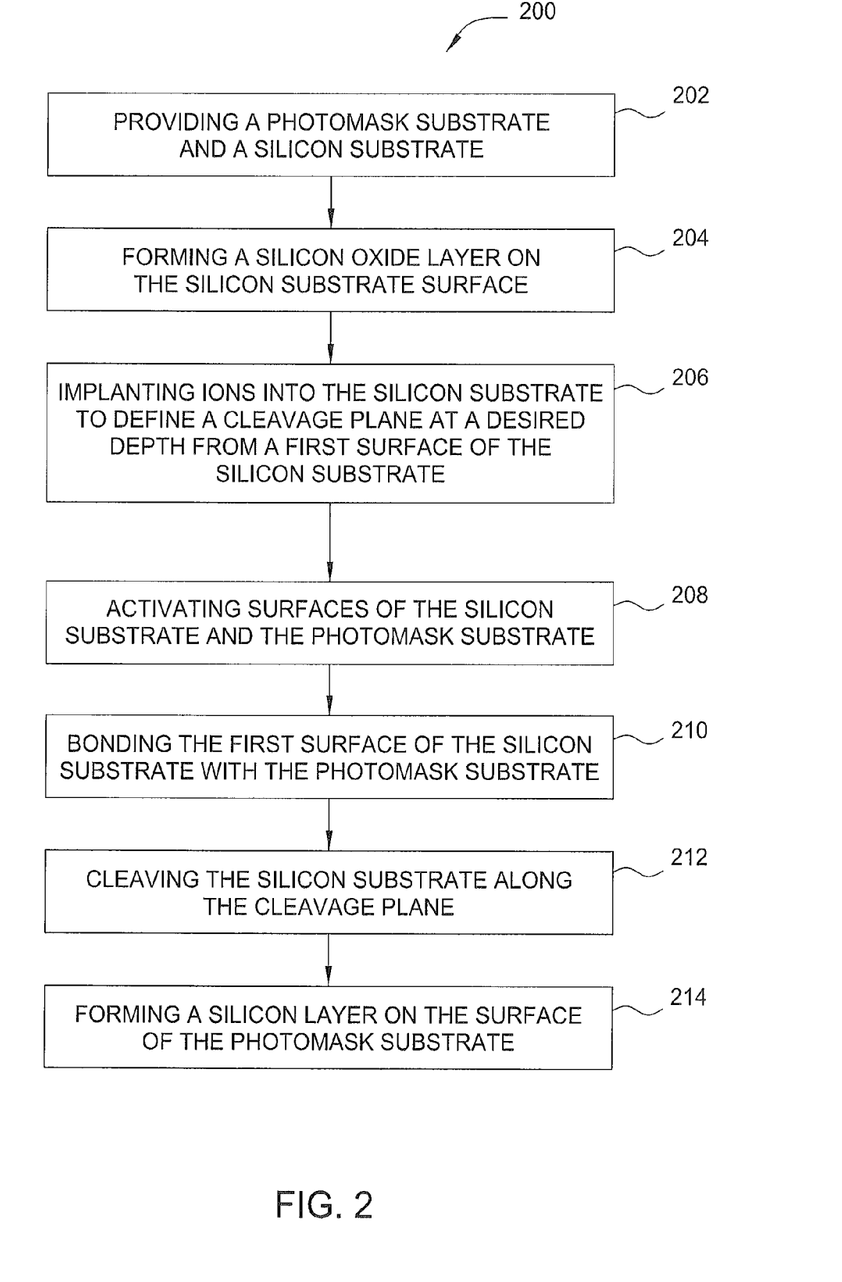
FIG. 2 depicts a process diagram illustrating a method for manufacturing a photomask substrate having a silicon layer formed thereon according to one embodiment of the present invention.

FIG. 2 depicts a process flow diagram of a method 200 for forming a crystalline silicon layer on a photomask substrate so as to provide a surface with minimum defects which can be used to form EUVL photomask. FIGS. 3A-3H are schematic cross-sectional views illustrating different stage of a pair of substrates, e.g., a silicon substrate and a quartz photomask, bonded to form a silicon layer on the quartz photomask for EUVL applications according to the method 200.

Figure 3A:
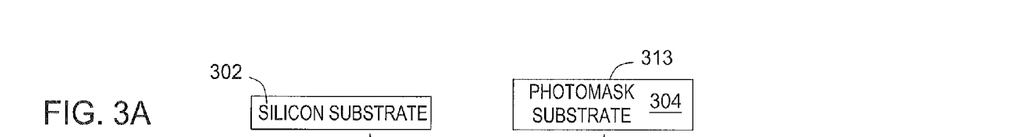
Figure 3B:
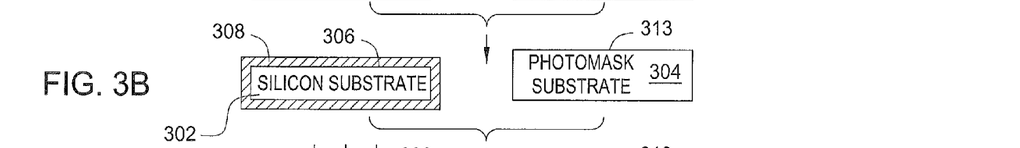

The method 200 begins at block 202 by providing at least two substrates (e.g., a pair), a first substrate 302 and a second substrate 304, as shown in FIG. 3A. The first substrate 302 provides a source having crystalline silicon materials, such as a single crystalline silicon layer or the like, that may be utilized to form on a surface 313 of the second substrate 304. In one embodiment, the first substrate 302 crystalline silicon (e.g., Si<100> or Si<111>), strained silicon, doped or undoped polysilicon, doped or undoped silicon wafers, doped silicon, glass or any silicon containing materials capable of providing crystalline silicon material. The second substrate 304 is a quartz substrate or a special low thermal expansion (LTE) material (i.e., low coefficient of thermal expansion less than 5 ppb/K) and substantially defect-free with desired flatness, such as about less than 30 nm peak-to-valley, that can be utilized to form a photomask (e.g., reticle) used in EUVL applications. In one embodiment, the low thermal expansion (LTE) material may include silicon, titanium and oxygen. The second substrate 304 has a rectangular shape having four sides between about 5 inches to about 9 inches in length. The second substrate 304 may be between about 0.15 inches and about 0.25 inches thick. In one embodiment, the second substrate 304 is about 0.25 inches thick.

At block 204, a thermal oxidation process is performed on the first substrate 302 to oxidize the surface and periphery of the first substrate 302, forming a silicon oxide layer 308 thereon. The silicon oxide layer 308 may have a thickness at between about 500 Å and about 5000 Å, such as between about 1000 Å and about 2000 Å. The silicon oxide layer 308 may facilitate bonding the first substrate 302 to the surface 313 of the second substrate 304 during the sequent bonding process.

Figure 3C:
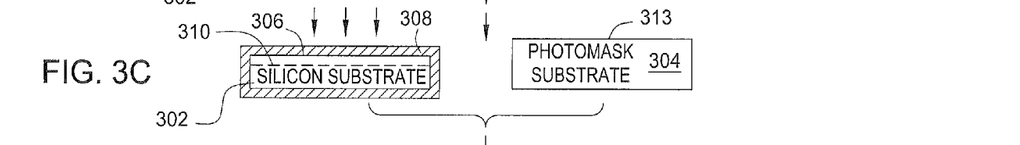

At block 206, a high energy cleavage ion implantation step is performed in which an ion species, such as hydrogen, is implanted to a uniform depth below a first surface 306 of the first substrate 302 to define a cleavage plane 310 within the first substrate 302, as shown in FIG. 3C. Within the cleavage plane 310, the ions implanted at block 206 creates damaged atomic bonds in the silicon crystal lattice, rendering the substrate susceptible to separation along the cleavage plane 310, as will be exploited later in the fabrication sequence described further below. In one embodiment, the cleavage plane 310 may be formed between about 100 Å and about 2000 Å, such as about 1000 Å, below the first surface 306 of the first substrate 302. The plasma immersion ion implantation process may be performed in the processing chamber 100 as described in FIG. 1 or other suitable reactors.

Figure 3D:
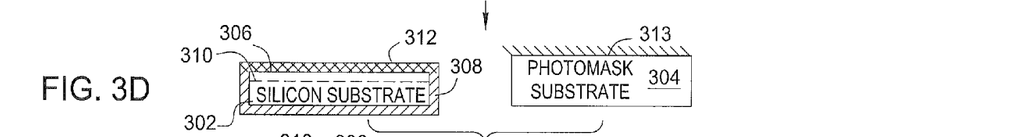

At block 208, an optional plasma immersion ion implantation process is utilized to activate the surfaces of the first and second substrates 302, 304, as shown in FIG. 3D. As the substrate surfaces 312, 313 may have native oxide, excess water (e.g., moisture) and hydrocarbon contamination from the adjacent environment, the loose texture and structure of native surface oxides may generate impurities and adversely affect quality of the subsequent bonding step. Excess water and hydrocarbon contamination may release hydrogen gas. $CO_2$ gas or other impurities during bonding process which may result in voids and bubbles trapped in the interface. Accordingly, an activating process and/or an etching process may be performed to activate the surfaces 312, 313 while removing undesired contaminants from the substrate surface. The activated ions/species used in the optional plasma immersion ion implantation process activates the surface 312, 313 and promotes bonding energy for subsequent bonding process while removes the undesired native oxide, water and hydrocarbon contamination from the substrate surface 312, 313.

The activating process performed at block 208 includes exposing the substrates to oxygen containing gas and/or a halogen containing gas in the plasma reactor while maintaining the ion energy at a low level. Suitable examples of oxygen containing gas include $O_2$, $H_2O$, $H_2O_2$, $O_3$, $N_2O$, $NO_2$, and the like. Suitable halogen containing gas include $Cl_2$, $F_2$, $Br_2$, HCl, HBr, $SF_6$, $NF_3$ and the like. The oxygen ions oxidize the surfaces 312, 313 of the substrates 302, 304 and convert the silicon oxide layer 308 and silicon material on the substrates 302, 304 into an oxidized state providing a hydrophilic surface promoting the bonding energy between the substrates 302, 304.

A low RF bias power voltage of less than about 500 Volts (V) may be applied ions formed from the oxygen and/or the halogen containing gas to bombard the substrates with low energy. In one embodiment, the oxygen and/or halogen containing gas may flow into the plasma reactor at a rate of between about 100 sccm and about 5000 sccm. The source RF power may be maintained at between about 50 Watts and about 2000 Watts at a RF voltage between about 0 Volts and about 500 Volts. The bias RF power may be maintained at between about 50 Watts and about 1000 Watts at a RF voltage between about 0 Volts and about 500 Volt, such as between about 50 Volts and about 250 Volts, for example, less than 200 Volts. The reactor pressure may be maintained at between about 5 mTorr and about 500 mTorr. The substrate temperature may be maintained at between about 100 degrees Celsius and about 1000 degrees Celsius, such as between about 450 degrees Celsius and about 750 degrees Celsius, for example about 600 degrees Celsius and about 700 degrees Celsius.

In another embodiment, the oxygen containing gas and/or the halogen containing gas supplied into the processing chamber 100 to activate the surface 312, 313 may be supplied with or replaced by an inert gas. Examples of suitable inert gases include Ar, He, Xe, Kr, $N_2$ and the like. The inert gas functions similar to the halogen containing gas. The inert gas in the processing chamber 100 collides with and removes the particles and/or contaminants from the substrate surface, thereby reducing the impurities from the substrate surfaces and thereby promoting the bonding energy as the substantially similar mechanism stated above.

The activated surfaces 312, 313 resulting from the plasma immersion ion implantation process at block 208 enhance bonding as the activated surfaces 312, 313 have a slight surface microroughness and good cleanliness. The plasma immersion ion implantation process at block 208 opens lattice sites which makes the lattice sites available to form covalent bonds with lattice sites in the other surface. Also, the activated surfaces 312, 313 are slightly rougher compared to an unetched surface, thus providing better occlusion on the contact surfaces to securely adhere to each other, thereby enhancing the bonding energy therebetween.

Figure 3E:
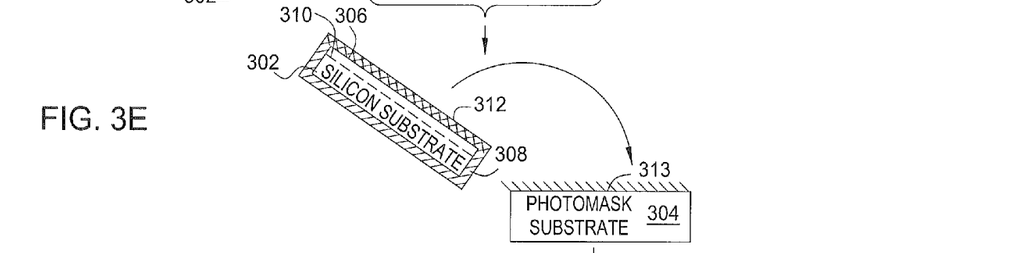
Figure 3F:
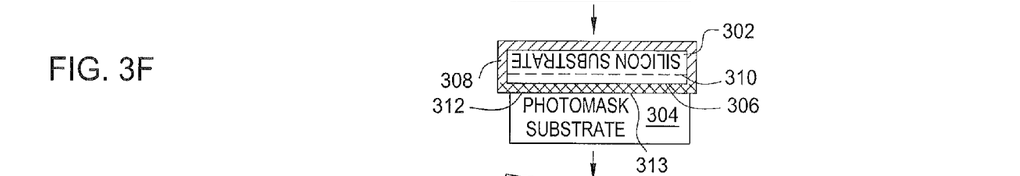

At block 210, the first substrate 302 is flipped over and bonded to the second substrate 304, as shown in FIG. 3E. Van der Wals forces cause the two surfaces 312, 313 to adhere. The adhesion between the surfaces 312, 313 may be enhanced by providing a thermal energy, e.g., heating the substrates 302, 304 to a predetermined temperature, during bonding process, as shown in FIG. 3F. In one embodiment, the substrates 302, 304 are heated to a temperature greater than about 800 degrees Celsius. The thermal energy causes the Van der Wals forces to be replaced by atomic bonds formed between facing lattice sites in the surfaces 312, 313. A greater proportion of the lattice atomic sites in each surface 312, 313 are available for electric bonding with lattice sites in the other surface. As a result, the bonding force between the substrates 302, 304 is increased over conventional techniques.

Figure 3G:
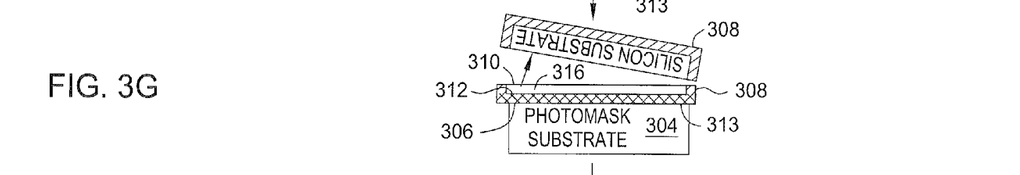
Figure 3H:
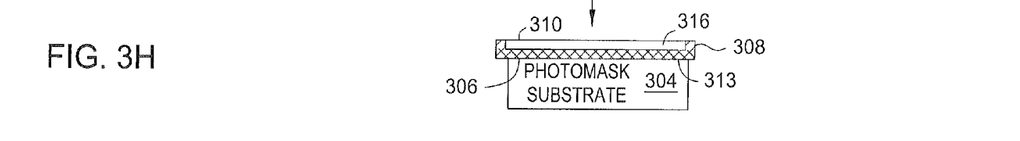

At block 212, the first substrate 302 is separated along the cleavage plane 310, leaving a thin portion 316 of the first substrate 302 bonded to the second substrate 304, as shown in FIG. 3G. The thin portion 316 includes a crystalline silicon layer, such as a single crystalline silicon layer, disposed on the silicon oxide layer 308 on the second substrate 304. The thin portion 316 left on the second substrate 304 may have a thickness between about 2 nm and about 100 nm.

At block 214, the thin portion 316 of the silicon layer from the first substrate 302 along with the silicon oxide layer 308 are bonded on the surface 313 of the second substrate 304 and can be later utilized to form a photomask using EUVL techniques.

As the split surface 310 formed on the second substrate 304 may becomes rough after cleavage or from ion bombardment at block 206, a surface smoothing process, such as a CMP process, or a polishing process, may be performed to smooth and recrystallize the surface of the silicon layer 316. The surface smoothing process may be performed by any suitable process. In one embodiment, the surface smoothing process may polish the silicon layer 316 to have a roughness of less than about 1.0 nm.

Figure 4:
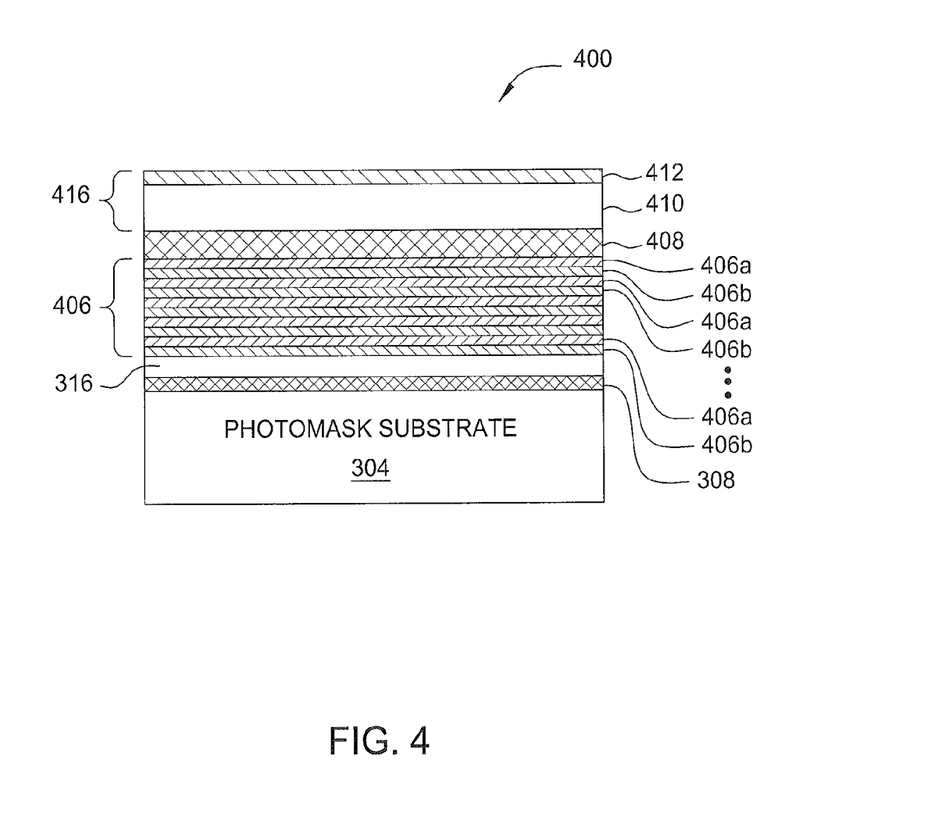
FIG. 4 depicts an exemplary embodiment having a film stack formed on a substrate having a silicon layer disposed thereon suitable for EUVL applications.

FIG. 4 depicts an exemplary embodiment having a film stack 400 formed on the second substrate 304 having the silicon layer 316 disposed thereon fabricated by the method 200. In one embodiment, the film stack 400 may include an EUV reflective multi-material layer 406 is disposed on the second substrate 304, such as a photomask quartz substrate. The reflective multi-material layer 406 may include at least one molybdenum layer 406a and a silicon layer 406b. Although the embodiment depicted in FIG. 4 shows five pairs of molybdenum layer 406a and a silicon layer 406b (alternating molybdenum layers 406a and the silicon layers 406b repeatedly formed on the photomask substrate 304), it is noted that number of molybdenum layers 406a and the silicon layers 406b may be varied based on different process needs. In one particular embodiment, forty pairs of molybdenum layers 406a and the silicon layers 406b may be deposited to form the reflective multi-material layer 406. In one embodiment, the thickness of each single molybdenum layer 406a may be controlled at between about 10 Å and about 100 Å, such as about 30 Å, and the thickness of the each single silicon layer 106b may be controlled at between about 10 Å and about 100 Å, such as about 40 Å. The reflective multi-material layer 406 may have a total thickness between about 2000 Å and about 5000 Å. The reflective multi-material layer 406 may have an EUV light reflectivity of up to 70% at wavelength of 13.5 nm. The reflective multi-material layer 406 may have a total thickness between about 200 nm and about 500 nm.

Subsequently, a capping layer 408 is disposed on the reflective multi-material layer 406. The capping layer 408 may be fabricated by a metallic material, such as ruthenium (Ru) material, zirconium (Zr) material, or any other suitable material. In the embodiment depicted in FIG. 4, the capping layer 408 is a ruthenium (Ru) layer. The capping layer 408 has a thickness between about 1 nm and about 5 nm.

An absorber layer 416 may then be disposed on the capping layer 408. The absorber layer 416 is an opaque and light-shielding layer configured to absorb a portion of the light generated during the lithography process. The absorber layer 416 may be in form of a single layer or a multi-layer structure, such as including a self-mask layer 412 disposed on a bulk absorber layer 410. In one embodiment, the absorber layer 416 has a total film thickness between about 50 nm and about 100 nm. The total thickness of the absorber layer 416 advantageously facilitates meeting the strict overall etch profile tolerance for EUV masks in sub-45 nm technology node applications.

In one embodiment, the bulk absorber layer 410 may comprise tantalum-based materials with essentially no oxygen, for example tantalum silicide based materials, such as TaSi, nitrogenized tantalum boride-based materials, such as TaBN, and tantalum nitride-based materials, such as TaN. The self-mask layer 412 may be fabricated from a tantalum and oxygen-based materials. The composition of the self-mask layer 412 corresponds to the composition of the bulk absorber layer 410 and may comprise oxidized and nitrogenized tantalum and silicon based materials, such as TaSiON, when the bulk absorber layer 410 comprises TaSi or TaSiN; tantalum boron oxide based materials, such as TaBO, when the bulk absorber layer 410 comprises TaBN; and oxidized and nitrogenized tantalum-based materials, such as TaON, when the bulk absorber layer 410 comprises TaN.

The film stack 400 may be later patterned or etched to form desired features, structures, or patterns to complete the EUV photomask manufacture process.

Figure 5:
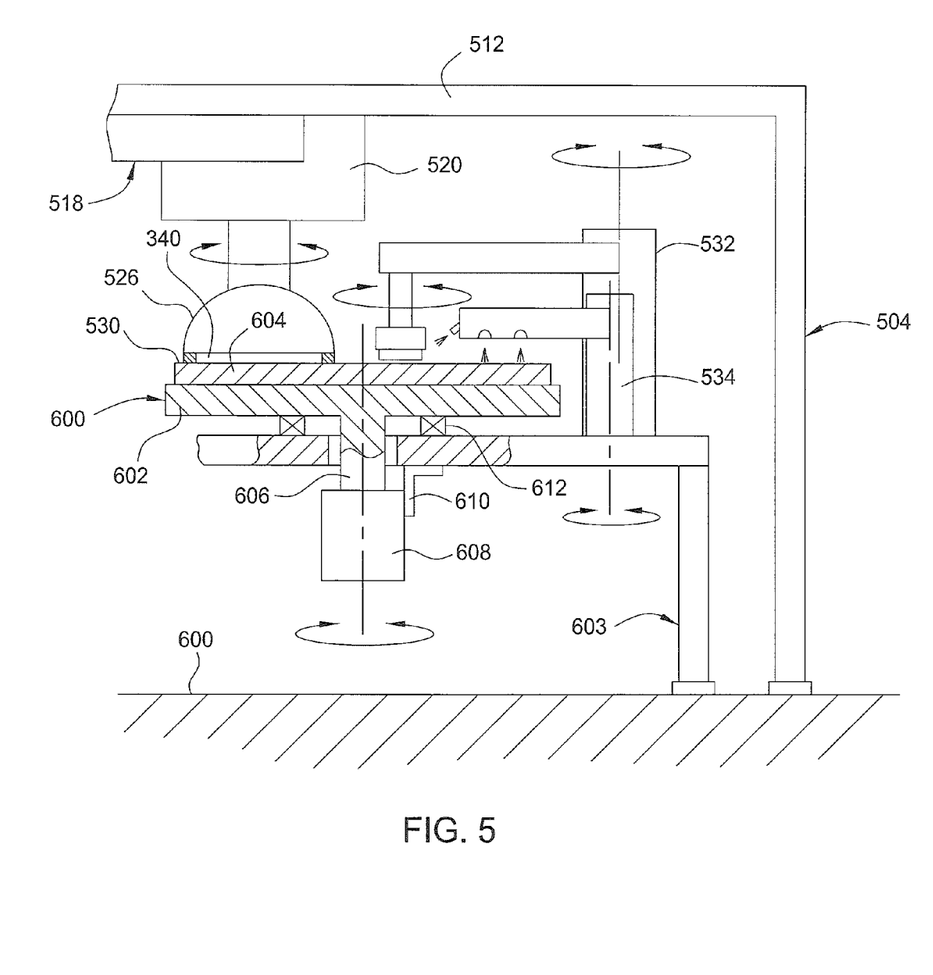
FIG. 5 is a side view of a polishing station of a CMP system according to one embodiment of the invention.

FIG. 5 is a partial side view showing one embodiment of a polishing station 504 that may be incorporated into a CMP system. The CMP system may include one or more polishing stations 504, only one of which is shown in FIG. 5 for ease of explanation. In the embodiment depicted in FIG. 5, the polishing station 504 includes a platen assembly 600 that supports a dielectric polishing pad 604 and a polishing head 526 that holds the substrate 304 during processing. An upper surface of the pad 604 forms the polishing surface 530. The platen 602 is movably supported on an inner frame 603 by one or more bearings 612. The platen 602 is coupled by a shaft 606 to a motor 608 that is operable to rotate the platen assembly 600. The motor 608 may be coupled by a bracket 610 to the inner frame 603. In one embodiment, the motor 608 is a direct drive motor. Other motors may also be utilized to rotate the shaft 606. In one embodiment depicted in FIG. 5, the motor 608 is utilized to rotate the platen assembly 600 such that the pad 604 retained thereon is rotated during processing while the substrate 340 is retained against the polishing surface 530 by the polishing head 526.

In one embodiment, the polishing head 526 is rotated at a rate from a range of about 10 rpm to about 150 rpm, for example, about 50 rpm to about 110 rpm, such as about 80 rpm to about 100 rpm. The polishing head 526 may press the substrate 530 against the pad 604 at a pressure in range of about 0.5 psi to about 5.0 psi, for example, about 1 psi to about 4.5 psi, such as about 1.5 psi to about 4.0 psi, for example. The polishing head 526 may have a moving range from about 10 to 14 inches. The polishing head 526 may be sweeping from a frequency of about 1 sweep per minute (swp/min) to about 40 swp/min, for example, about 5 swp/min to about 30 swp/min, such as about 12 swp/min to about 25 swp/min. Each sweep may be about 10 to about 14 inches.

The platen assembly 600 may be large enough to support a polishing pad 604 which will accommodate polishing of at least two substrates retained by different polishing heads 526 and served by different polishing units. In one embodiment, the dielectric polishing pad 604 has a diameter greater than about 30 inches, for example, between about 30 and about 52 inches, such as 42 inches. Even though the dielectric polishing pad 604 may be utilized to polish two substrates simultaneously, the pad unit area per number of substrate simultaneously polished thereon is much greater than conventional single substrate pads, thereby allowing the pad service life to be significantly extended.

During processing or when otherwise desired, the conditioning module 532 may be activated to contact and condition the polishing surface 530. Additionally, polishing fluid is delivered through the polishing fluid delivery module 534 to the polishing surface 530 during processing. The distribution of polishing fluid provided by the polishing fluid delivery module 534 may be selected to control the distribution of polishing fluid across the lateral surface of the polishing surface 530. It should be noted that while only one polishing head 526, conditioning module 532 and polishing fluid delivery module 534 are depicted in FIG. 5, more numbers of polishing heads and conditioning modules, polishing fluid delivery modules are possible.

Figure 6A:
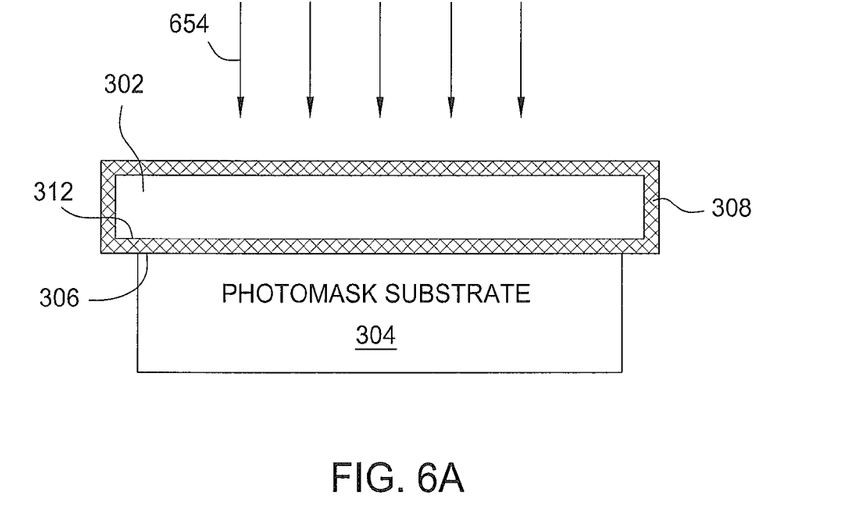
FIG. 6A-6B depict a process diagram illustrating a method for manufacturing a photomask substrate having a silicon layer formed thereon according to one embodiment of the present invention.
Figure 6B:
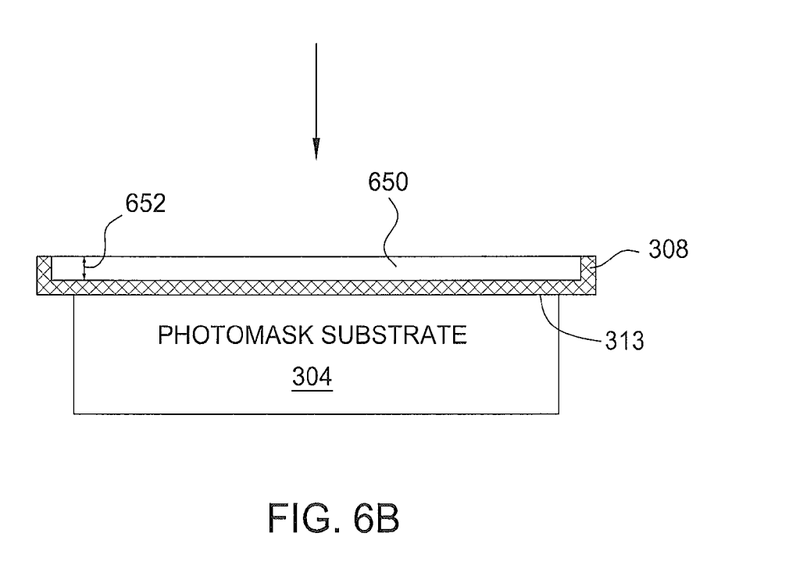

FIGS. 6A-6B depict a process diagram illustrating a method for manufacturing a photomask substrate having a silicon layer 650 formed thereon according to one embodiment of the present invention. Similar to the embodiment described above with referenced to FIG. 2, the first substrate 302 is flipped over to disposed on the second substrate 304. Unlike the second substrate 304 described above with referenced to FIGS. 3C-3E, an ion implantation process performed at block 206 is eliminated. The cleavage plan 310 does not need to be defined in the second substrate 304. A chemical mechanical process (CMP), as shown by arrow 654 depicted in FIG. 6A, may be utilized to polish away the excess silicon in the first substrate 302 until a desired thickness 652 of the first substrate 302 is left on the second substrate 304, forming the desired silicon layer 650 thereon, as shown in FIG. 6B. By utilizing the CMP process to polish away the excess silicon in the first substrate 302, the ion implantation process at block 206 is eliminated since the a cleavage plan does not need to be defined to damage atomic bonds in the silicon crystal lattice, rendering the substrate susceptible to separation along the cleavage plane 310.

Therefore, in the embodiment depicted in FIGS. 6A-6B, the second substrate 304 only needs to undergo the silicon oxide layer formation process at block 204, surface activation process at block 208, and then the bonding process at step 210. Subsequently, the bonded substrates 302, 304 is then transferred to a polishing station, such as the polishing station 504 depicted in FIG. 5, to polish away the excess silicon until the desired thickness 652 of the first substrate 302 is remained on the second substrate 304, forming the silicon layer 650 on the second substrate 304. The remaining thickness 650 of the silicon layer 650 from the first substrate 302 along with the silicon oxide layer 308 are bonded on the surface 313 of the second substrate 304 and can be later utilized to form a photomask using EUVL techniques.

Thus, methods for forming a silicon layer on a photomask substrate with minimum defects are provided. The method utilizes a first substrate providing single crystalline silicon source to be bonded to a second substrate, such as a photomask substrate, thereby forming a silicon layer on the second substrate sourced from the first substrate. The silicon layer formed on the second substrate may provide a good silicon surface that allows the film structures later formed thereon with desired profile and dimension without distortion and deformation. Furthermore, the silicon layer with minimum defects may also reduce likelihood of the phase shift while using the resultant second substrate later during a EUVL process.

While the foregoing is directed to embodiments of the present invention, other and further embodiments of the invention may be devised without departing from the basic scope thereof, and the scope thereof is determined by the claims that follow.

What is claimed:

1. A method for forming a silicon layer on a photomask substrate, comprising:
   performing an oxidation process to form a silicon oxide layer on a surface of a first substrate wherein the first substrate comprises a crystalline silicon material;
   performing an ion implantation process to define a cleavage plane in the first substrate; and
   bonding the silicon oxide layer to a surface of a second substrate, wherein the second substrate is a photomask substrate.

2. The method of claim 1, further comprising:
   splitting the first substrate along the cleavage plane.

3. The method of claim 2, further comprising:
   forming a crystalline silicon layer and leaving the silicon oxide layer on the surface of the second substrate.

4. The method of claim 1, wherein performing the ion implantation process to define the cleavage plane further comprises:
   activating the surfaces of the first and the second substrates prior to bonding the substrates.

5. The method of claim 4, wherein activating the surfaces of the first and the second substrates further comprises:
   exposing the first and the second substrates to an oxygen gas.

6. The method of claim 5, wherein exposing the substrates to an oxygen gas further comprises:
   oxidizing the surfaces of the first and the second substrate; and
   altering the surfaces of the first and the second substrate into hydrophilic state.

7. The method of claim 1, wherein bonding the surface further comprises:
   heating the bonded substrates to a temperature greater than about 800 degrees Celsius.

8. The method of claim 3, further comprising:
   forming a film stack on the crystalline silicon layer to form a photomask structure utilized for EUVL process.

9. The method of claim 2, wherein the crystalline silicon layer is a single crystal silicon layer.

10. The method of claim 1, wherein the second substrate comprises low thermal expansion material including silicon, titanium and oxygen.

11. The method of claim 1, wherein performing the ion implantation process to define the cleavage plane further comprising:
    implanting hydrogen ions into a predetermined depth from the surface of the first substrate.

12. The method of claim 11, wherein the predetermined depth is controlled at between about 2 nm and about 100 nm.

13. The method of claim 2, further comprising:
    polishing the silicon layer formed on the second substrate to control a surface roughness less than about 1 nm.

14. The method of claim 1, wherein the second substrate is a quartz substrate.

15. The method of claim 1, wherein the first substrate and the second substrate are fabricated from different materials.

16. A method for forming a silicon layer on a photomask substrate, comprising:
    performing an oxidation process to form a silicon oxide layer on a first surface of a first substrate, wherein the first substrate comprises a crystalline silicon material;
    bonding the silicon oxide layer to a first surface of a second substrate;
    performing a polishing process to polishing a portion of the first substrate from a second surface of the first substrate; and
    forming a crystalline silicon layer from the first substrate on the surface of the second substrate, wherein the second substrate is a photomask substrate.

17. The method of claim 16, wherein the polishing process is a chemical mechanical polishing process.

18. The method of claim 16, wherein the crystalline silicon layer is a single crystalline silicon layer.

19. The method of claim 16, wherein the crystalline silicon layer has a thickness between about 2 nm and about 100 nm.

20. The method of claim 16, wherein the second substrate is a quartz substrate.

* * * * *

UNITED STATES PATENT AND TRADEMARK OFFICE
CERTIFICATE OF CORRECTION

PATENT NO. : 8,962,224 B2  Page 1 of 1
APPLICATION NO. : 13/774010
DATED : February 24, 2015
INVENTOR(S) : Wu et al.

It is certified that error appears in the above-identified patent and that said Letters Patent is hereby corrected as shown below:

In the Specification

In Detailed Description:

Column 7, Line 2, please delete "FIG. 30" and insert --FIG. 3C-- therefor.

Signed and Sealed this
Twenty-first Day of July, 2015

Michelle K. Lee
*Director of the United States Patent and Trademark Office*